United States Patent
Fujimoto

(10) Patent No.: US 11,422,459 B2
(45) Date of Patent: Aug. 23, 2022

(54) DATA GENERATION METHOD, IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Masayoshi Fujimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 323 days.

(21) Appl. No.: 16/413,941

(22) Filed: May 16, 2019

(65) Prior Publication Data

US 2019/0361341 A1 Nov. 28, 2019

(30) Foreign Application Priority Data

May 23, 2018 (JP) .............................. JP2018-099018

(51) Int. Cl.
*G03F 7/00* (2006.01)
*B29C 43/56* (2006.01)
*B29C 43/02* (2006.01)

(52) U.S. Cl.
CPC .......... *G03F 7/0002* (2013.01); *B29C 43/021* (2013.01); *B29C 43/56* (2013.01); *B29C 2043/025* (2013.01)

(58) Field of Classification Search
CPC . B29C 2043/025; B29C 43/021; B29C 43/56; G03F 7/0002; G03F 7/168; G03F 7/70508; G03F 7/70775; G03F 9/7003
See application file for complete search history.

(56) References Cited

U.S. PATENT DOCUMENTS

| | | | |
|---|---|---|---|
| 10,168,615 B2 | 1/2019 | Yamashita et al. | |
| 2009/0014917 A1* | 1/2009 | Hodge | B82Y 40/00 264/401 |
| 2009/0115110 A1* | 5/2009 | Schumaker | B82Y 40/00 264/401 |
| 2010/0098859 A1* | 4/2010 | Schumaker | B82Y 40/00 427/256 |
| 2015/0014876 A1* | 1/2015 | Yamashita | G03F 7/0002 264/40.1 |
| 2015/0017329 A1* | 1/2015 | Fletcher | B29C 43/021 427/277 |

FOREIGN PATENT DOCUMENTS

| | | |
|---|---|---|
| JP | 2013197389 A | 9/2013 |
| JP | 2015018982 A | 1/2015 |
| JP | 2016082100 A | 5/2016 |

* cited by examiner

*Primary Examiner* — Robert J Grun
(74) *Attorney, Agent, or Firm* — Rossi, Kimms & McDowell LLP

(57) ABSTRACT

A data generation method generates data for controlling an arrangement step in an imprint process that includes the arrangement step of arranging an imprint material on a substrate, a contact step of bringing the imprint material and a pattern portion of a mold into contact with each other, and a curing step of curing the imprint material. The method includes performing a first step of determining a plurality of first positions, based on information related to a boundary of the pattern portion in the substrate, as positions where the imprint material is to be arranged, and performing a second step of determining, after the first step, a plurality of second positions different from the plurality of first positions, as positions where the imprint material is to be further arranged.

15 Claims, 11 Drawing Sheets

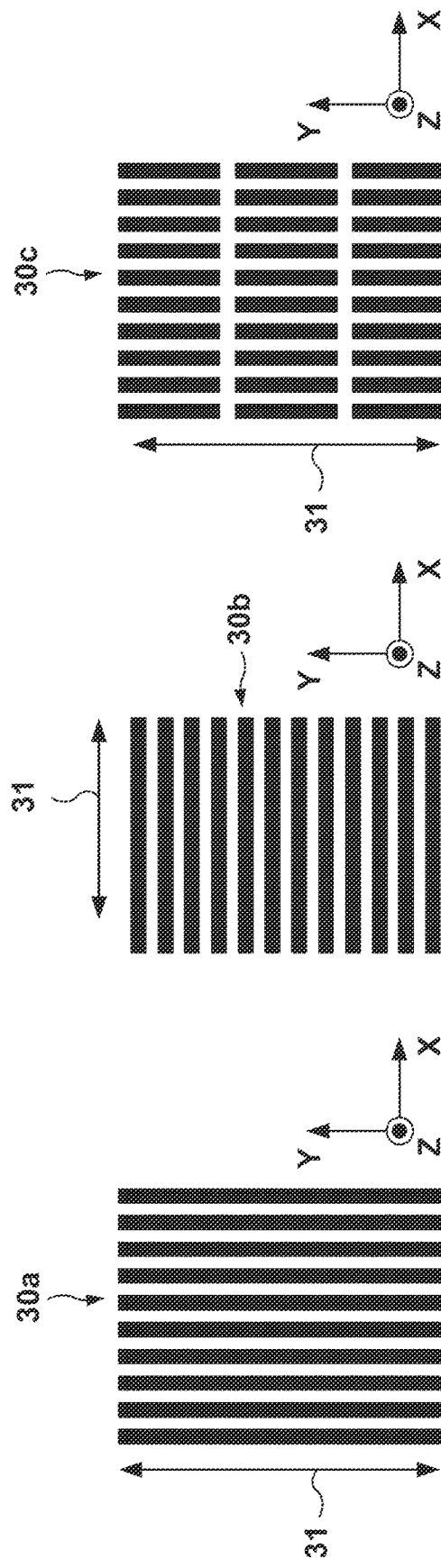
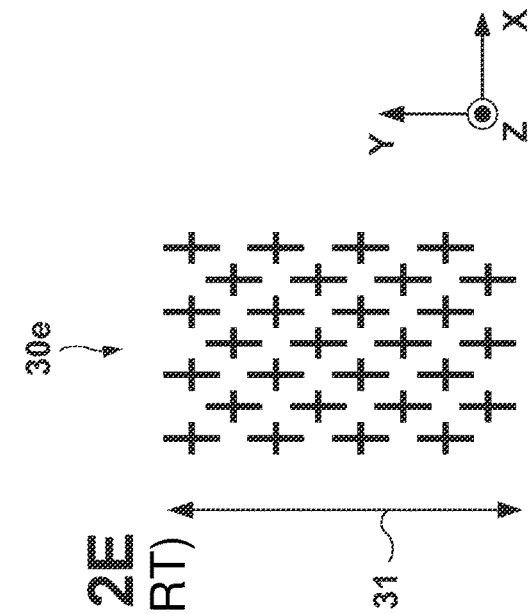
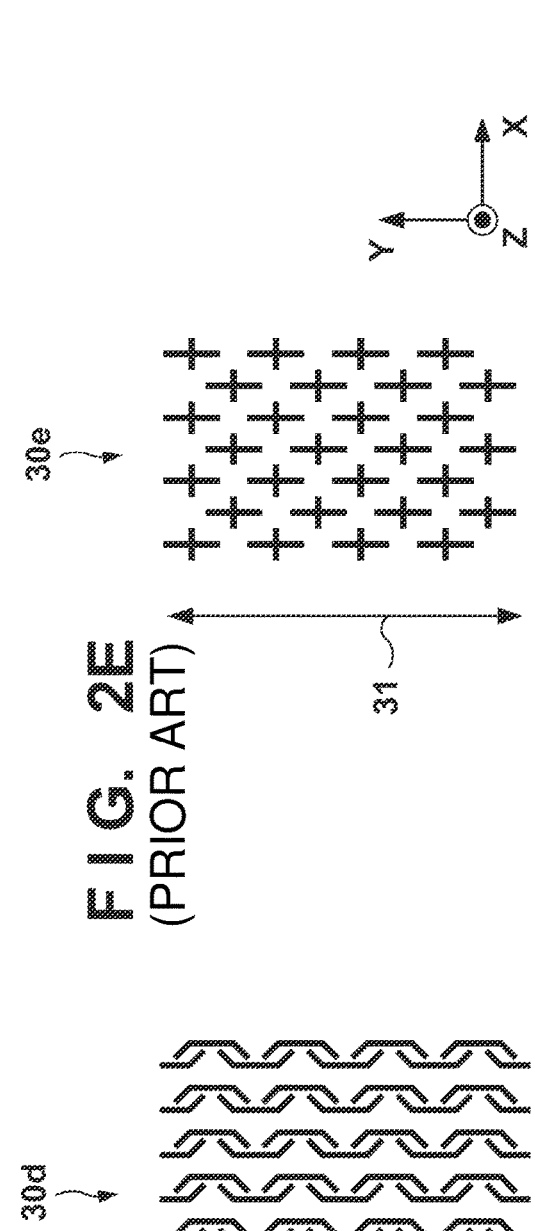
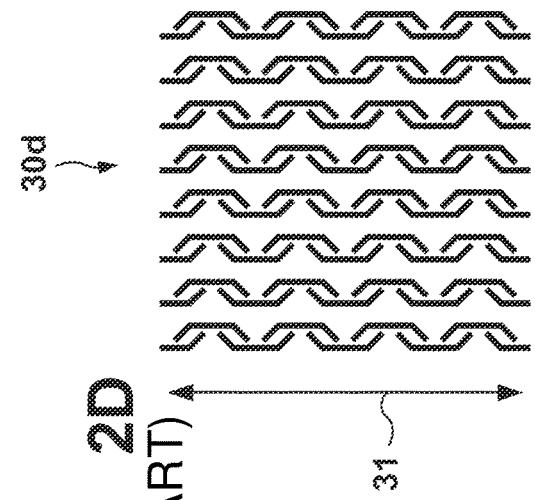
FIG. 2A (PRIOR ART)
FIG. 2B (PRIOR ART)
FIG. 2C (PRIOR ART)
FIG. 2D (PRIOR ART)
FIG. 2E (PRIOR ART)

(PRIOR ART)
FIG. 3A
(PRIOR ART)
FIG. 3B
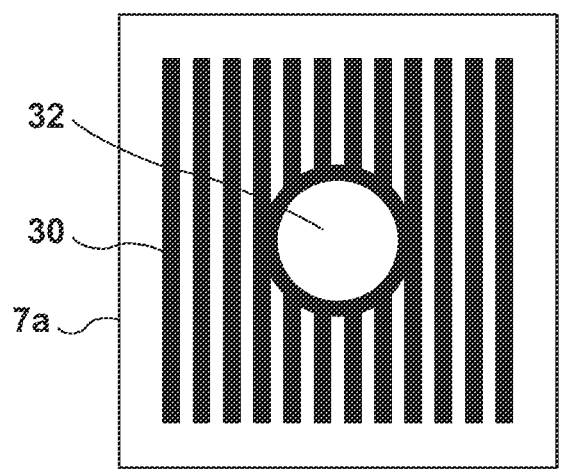
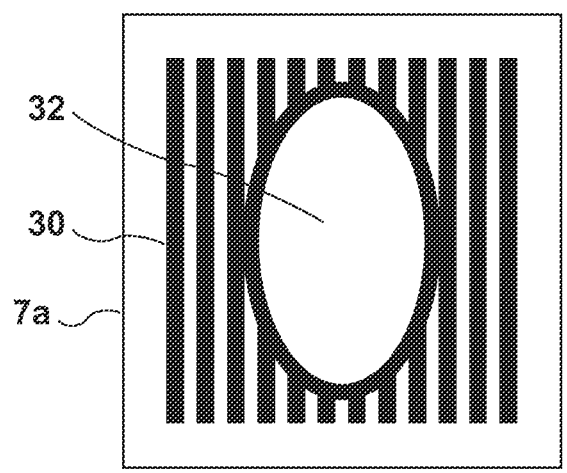

DATA GENERATION METHOD, IMPRINT METHOD, IMPRINT APPARATUS, AND METHOD OF MANUFACTURING ARTICLE

BACKGROUND OF THE INVENTION

Field of the Invention

The present invention relates to a data generation method, an imprint method, an imprint apparatus, and a method of manufacturing an article.

Description of the Related Art

An imprint apparatus forms a pattern made of a cured product of an imprint material on a substrate by arranging the imprint material on the substrate, bringing the imprint material and a pattern portion of a mold into contact with each other, and subsequently curing the imprint material. Normally, a plurality of droplets of an imprint material are arranged on a substrate, and an imprint material film can be formed between the substrate and a pattern portion of the mold when the plurality of droplets and the pattern portion of the mold are brought into contact with each other and the droplets spread. How easily the imprint droplets can spread can depend on the direction in which lines forming the pattern of the pattern portion extend. In Japanese Patent Laid-Open No. 2015-18982, there is disclosed that a main axis direction of a concave-convex pattern formed in a mold is set and a resin application position is determined by setting the distance between resin droplets which are applied spaced apart from each other in the main axis direction to be longer than a distance between resin droplets which are applied spaced apart from each other in a direction perpendicular to the main axis direction.

In a substrate, a position that faces the boundary of a pattern portion is a region where the imprint material filling operation tends to be delayed. If an imprint material is arranged on the substrate without consideration to this point, it will take a long time until the completion of the imprint material filling operation, and thus degrade the throughput.

SUMMARY OF THE INVENTION

The present invention provides a technique advantageous in improving throughput.

One of aspects of the present invention provides a data generation method of generating data for controlling an arrangement step in an imprint process that includes the arrangement step of arranging an imprint material on a substrate, a contact step of bringing the imprint material and a pattern portion of a mold into contact with each other, and a curing step of curing the imprint material, the method comprising: performing a first step of determining a plurality of first positions, based on information related to a boundary of the pattern portion in the substrate, as positions where the imprint material is to be arranged; and performing a second step of determining, after the first step, a plurality of second positions different from the plurality of first positions, as positions where the imprint material is to be further arranged.

Further features of the present invention will become apparent from the following description of exemplary embodiments with reference to the attached drawings.

BRIEF DESCRIPTION OF THE DRAWINGS

FIGS. 2A to 2E are views showing examples of patterns that can be included in a pattern portion of a mold;

FIGS. 3A and 3B are views exemplifying the change in the shape of an imprint material droplet in a contact step;

DESCRIPTION OF THE EMBODIMENTS

Exemplary embodiments of the present invention will be described hereinafter with reference to the accompanying drawings.

Figure 1:
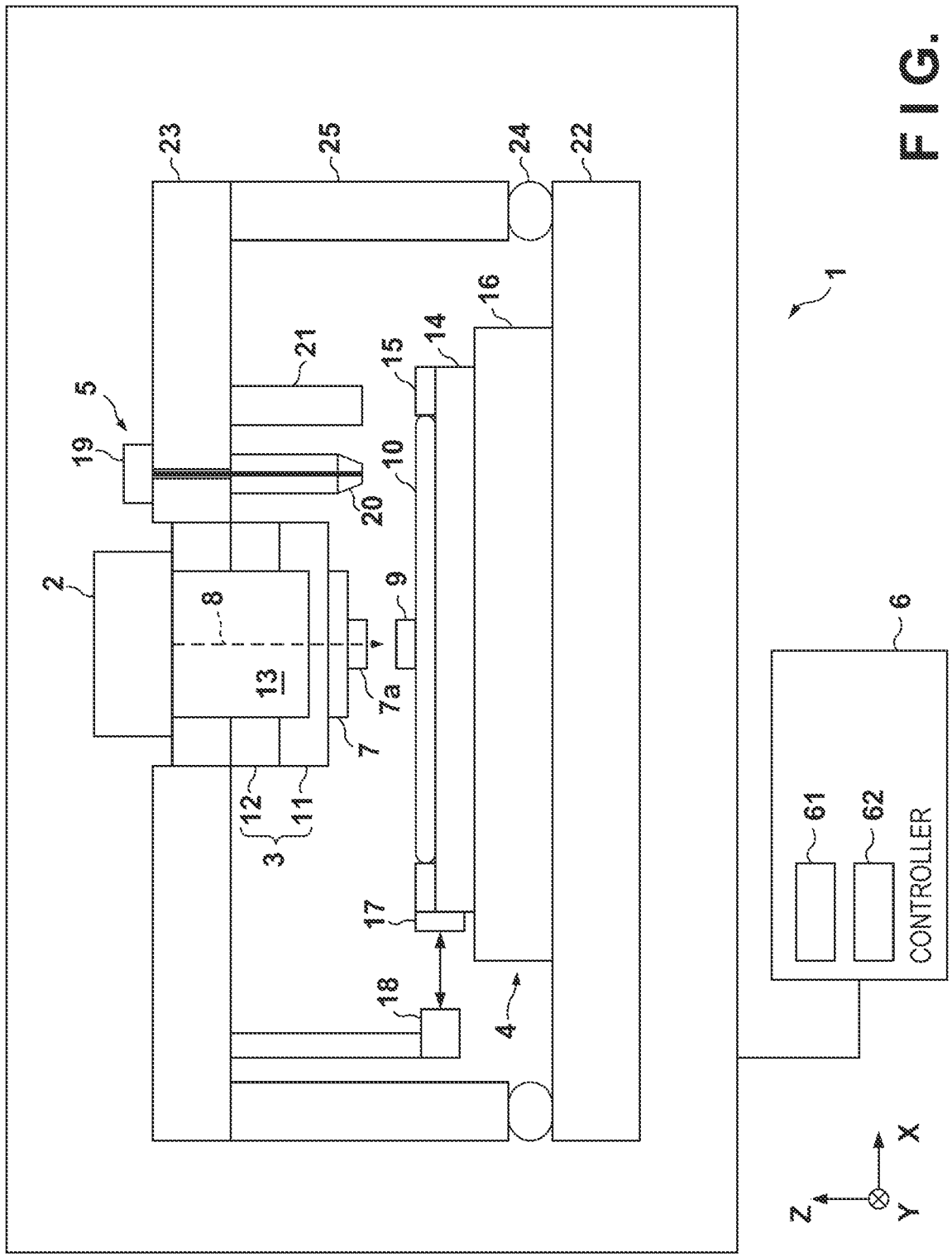
FIG. 1 is a view showing the arrangement of an imprint apparatus according to an embodiment of the present invention.

FIG. 1 shows the arrangement of an imprint apparatus 1 according to the first embodiment of the present invention. The imprint apparatus 1 performs an imprint process that includes an arrangement step of arranging an imprint material 9 on (a shot region of) a substrate 10, a contact step of bringing the imprint material 9 and a pattern portion 7a of a mold 7 into contact with each other, and a curing step of curing the imprint material 9. A controller 6 can be embedded in or the controller 6 can be connected to the imprint apparatus 1. The controller 6 can perform a data generation method of generating data (a drop recipe) for controlling the arrangement step. The controller 6 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general purpose computer embedded with a program, or a combination of all or some of these components.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

In the specification and the accompanying drawings, directions will be indicated by an XYZ coordinate system in which directions parallel to the surface of the substrate 10 are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the θX-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment can include control of the position and/or orientation of at least one of the substrate and the mold.

The imprint apparatus 1 can include a curing unit 2, a mold driving mechanism 3, a substrate driving mechanism 4, a dispenser 5, and the controller 6. The controller 6 can control the operations of components such as the curing unit 2, the mold driving mechanism 3, the substrate driving mechanism 4, the dispenser 5, and the like of the imprint apparatus 1. The curing unit 2 irradiates the imprint material 9 with a curing energy 8 (for example, light such as ultraviolet light) after, for example, the imprint material 9 on a shot region of the substrate 10 and the pattern portion 7a of the mold 7 have been brought into contact with each other and the alignment of the shot region and the pattern portion 7a has been completed. The imprint material 9 is cured as a result, and a pattern made of the cured imprint material 9 is formed. In one example, the curing unit 2 can include a light source that generates light of a wavelength capable of curing the imprint material 9 and an illumination optical system that adjusts the light from the light source and irradiates the imprint material 9 with the light. The illumination optical system can include, for example, a lens, a mirror, an aperture, and a shutter.

The peripheral shape of the mold 7 can be a polygon (preferably, a rectangle or a square). The mold 7 includes the pattern portion 7a on a side that faces the substrate 10. A pattern to be transferred to the substrate 10 (the imprint material 9 on the substrate 10) is formed in the pattern portion 7a. The pattern of the pattern portion 7a is formed by a convex portion and a concave portion which is dented more than the convex portion. A portion other than the convex portion is the concave portion, and a portion other than the concave portion is the convex portion. In this specification, a pattern represents an aggregate of various kinds of features (for example, a contact pattern and a line pattern). The mold 7 is preferably made of a material that can transmit the curing energy 8 and has a low thermal expansion coefficient, and can be made of, for example, quartz. The mold 7 can also include a cavity on the opposite side of the side on which the pattern portion 7a is arranged. The cavity can have, for example, a circular shape which is projected shape of the substrate chuck 14.

Patterns 30a to 30e formed on the pattern portion 7a of the mold 7 are exemplified in FIGS. 2A to 2E. The pattern 30a exemplified in FIG. 2A is a pattern that is formed by a plurality of features whose main axis direction 31 is parallel to the Y-axis direction. In this case, "the main axis direction" is a direction in which fine concave portions extend, and from another point of view, it is a direction in which the imprint material 9 can flow easily when the concave portions of the pattern formed in the pattern portion 7a are filled with the imprint material 9. Next, the pattern 30b exemplified in FIG. 2B is a pattern that is formed by a plurality of features whose main axis direction 31 is parallel to the X-axis direction. Next, the pattern 30c exemplified in FIG. 2C is a pattern formed by a plurality of features whose main axis direction 31 is parallel to the Y-axis direction and have been divided into a plurality of blocks in the Y-axis direction. The pattern 30d exemplified in FIG. 2D is a pattern formed by a plurality of features in which the fine concave portions have a plurality of curved parts in the planar direction. In this pattern 30d, the main axis direction 31 of the pattern 30d can be considered to be the Y-axis direction if the length of each concave portion in the Y-axis direction is longer than the length in the X-axis direction. The pattern 30e exemplified in FIG. 2E is a pattern formed by a plurality of features in which each fine concave portion intersects with another fine concave portion so as to form a cross shape. In this pattern 30e, the main axis direction 31 of the pattern 30e can be considered to be the Y-axis direction if the length of each concave portion in the Y-axis direction is longer than the length in the X-axis direction.

The mold driving mechanism 3 can include a mold chuck 11 that holds the mold 7, a mold driving actuator 12 that drives the mold 7 by driving the mold chuck 11, and a shape correction mechanism (not shown) that corrects the shape of (the pattern portion 7a of) the mold 7. The mold chuck 11 can hold the mold 7 by chucking, by using a suction force such as a vacuum suction force or an electrostatic force, a region outside the region where the curing energy 8 is transmitted in the mold 7.

When the mold 7 is to be held by, for example, the vacuum suction force, the mold chuck 11 is connected to a vacuum pump (not shown), and the suction force (holding force) of the mold 7 can be adjusted by adjusting the air exhaustion amount of this vacuum pump. The mold driving actuator 12 can be configured to bring the mold 7 into contact with the imprint material 9 on the substrate 10 and to separate the mold 7 from the cured imprint material 9. The mold driving actuator 12 can include, for example, a linear motor or an air cylinder. The mold driving mechanism 3 can be formed from a plurality of driving systems, such as a combination of a coarse driving system and a fine driving system, to position the mold 7 with high accuracy. Furthermore, the mold driving mechanism 3 may not only include an adjustment mechanism with respect to the Z-axis direction but also include adjustment mechanisms with respect to the X-, Y-, and θZ-axes and an adjustment mechanism related to the tilt (the θX-axis and the θY-axis) of the mold 7. Although the mold driving mechanism 3 can bring the mold 7 into contact with the imprint material 9 on the substrate 10 and separate the mold 7 from the cured imprint material 9 in the above-described manner, these operations may be performed by the substrate driving mechanism 4 or by both the mold driving mechanism 3 and the substrate driving mechanism 4.

A measurement device that measures the position of the mold 7 when the mold 7 is driven by the mold driving mechanism 3 may be arranged. The measurement device can be, for example, an optical displacement gauge that measures the distance between the mold 7 and the substrate 10. The shape correction mechanism corrects the shape of the mold 7 (the pattern portion 7a) by, for example, mechanically applying a force or displacement on the side surface of the mold 7. The mold chuck 11 and the mold driving actuator 12 includes, in (inside) their respective center portions in the planar direction, an opening region 13 that allows the curing energy 8 from the curing unit 2 to pass through to the substrate 10.

The substrate driving mechanism 4 holds and positions the substrate 10. The substrate driving mechanism 4 can include, for example, a substrate chuck 14 that holds the substrate 10 by the suction force, an auxiliary member 15 that is set so as to surround the periphery of the substrate 10, and a substrate actuator 16 that drives the substrate 10 by driving the substrate chuck 14. The substrate chuck 14 can include, for example, a plurality of pins that hold the substrate 10 when the substrate 10 is to be loaded and unloaded. The auxiliary member 15 can have the same surface height as the substrate 10 placed on the substrate chuck 14.

The substrate actuator 16 can include, for example, a linear motor or a planar motor. Only the mover of the substrate actuator 16 is shown in FIG. 1. The substrate driving mechanism 4 can be formed by a plurality of driving mechanisms, such as a coarse driving system and a fine driving system, with respect to the X-axis and the Y-axis. Furthermore, the substrate driving mechanism 4 can include a driving mechanism for performing adjustment with respect to the Z-axis of the substrate 10, a driving mechanism for performing adjustment with respect to the θZ-axis of the substrate 10, and an adjustment mechanism with respect to the tilt (the θX-axis and the θY-axis) of the substrate 10. The substrate driving mechanism 4, can include, on the side surface of the substrate chuck 14 or a moving portion integrated with the substrate driving mechanism, a plurality of reference mirrors 17 corresponding to the X-, Y-, Z-, ωx-, ωy-, and ωz-axes. The imprint apparatus 1 can include a plurality of laser interferometers 18 that measure the position of the substrate chuck 14 (the substrate 10) by using the plurality of reference mirrors 17. The plurality of laser interferometers 18 measure the real-time position of the substrate chuck 14 (the substrate 10), and the controller 6 executes positioning control on the substrate chuck 14 (the substrate 10) based on the measurement values. Instead of the interferometers as described above, encoders or the like may be employed as the position measurement devices.

The dispenser 5 is installed near the mold driving mechanism 3 and supplies or arranges droplets of the imprint material 9 on a shot region (pattern formation region) of the substrate 10. The dispenser 5 can supply or arranged the imprint material 9 on the substrate 10 by, for example, an inkjet method. The dispenser 5 can include a container 19 that stores the imprint material 9 and a discharge unit 20. The internal space of the container 19 can be maintained to have, for example, an atmosphere containing a small amount of oxygen so as to inhibit the curing reaction of the imprint material 9. The container 19 can be made of a material that will prevent particles and chemical impurities from mixing into the imprint material 9. The discharge unit 20 can include, for example, a piezoelectric-type discharge mechanism (inkjet head) including a plurality of discharge orifices. The imprint material 9 can be discharged in the form of droplets from the discharge unit 20. The supply amount (discharge amount) of the imprint material 9 can be adjusted to fall within the range of, for example, 0.1 to 10 pL/droplet, and can normally be adjusted to about 1 pL/droplet. The overall supply amount of the imprint material 9 to a shot region of the substrate 10 can be determined based on the density of the pattern formed on the pattern portion 7a and the desired residual layer thickness. The dispenser 5 arranges the imprint material 9 as droplets (droplets 32 to be described later) on the shot region of the substrate 10 based on an operation instruction from the controller 6.

The imprint apparatus 1 includes an alignment measurement device 21 that measures each alignment mark provided on the substrate 10. The imprint apparatus 1 can also include a base plate 22 that supports the moving portion (including the substrate chuck 14 and the mover of the substrate actuator 16) of the substrate driving mechanism 4 and a bridge plate 23 that holds the mold driving mechanism 3. The imprint apparatus 1 also includes columns 25 that extend from the base plate 22 and support the bridge plate 23 via anti-vibration devices 24 which remove the vibration from a floor surface. Although they are not shown, the imprint apparatus 1 can also include a mold transport mechanism that transports the mold 7 and a substrate transport mechanism that transports the substrate 10.

An operation (imprint method) of the imprint apparatus 1 will be described hereinafter. First, the controller 6 drives the substrate transport mechanism so that the substrate 10 will be transported onto the substrate chuck 14. Next, the controller 6 causes the substrate driving mechanism 4 to position the substrate 10 and causes the alignment measurement device 21 to measure the positions of the alignment marks on the substrate 10. Next, the controller 6 calculates the position of a shot region on the substrate 10 based on the measurement result obtained by the alignment measurement device 21 and controls the dispenser 5, the mold driving mechanism 3, the substrate driving mechanism 4, and the curing unit 2 so that a pattern will be formed on the shot region.

The imprint process for forming a pattern on one shot region in this case can include an arrangement step of arranging the imprint material 9 on a shot region of the substrate 10, a contact step of bringing the imprint material 9 and the pattern portion 7a of the mold 7 into contact with each other, and a curing step of curing the imprint material 9. In the arrangement step, the controller 6 first controls the substrate driving mechanism 4 so that the shot region will be positioned near the lower portion of the discharge unit 20 of the dispenser 5. Subsequently, the controller 6 will control the substrate driving mechanism 4 to scan the substrate 10 while causing the imprint material 9 to be discharged from the discharge unit 20 of the dispenser 5 in synchronization with the scan. As a result, the droplet of the imprint material 9 is arranged on the shot region.

Next, in the contact step, the controller 6 controls the substrate driving mechanism 4 so that the shot region arranged with the imprint material 9 will be positioned below the pattern portion 7a of the mold 7. Then, the controller 6 controls the mold driving mechanism 3 and the substrate driving mechanism 4 so as to position the shot region and the pattern portion 7a. This control can include correcting the shape of the pattern portion 7a by the shape correction mechanism incorporated in the mold driving mechanism 3. Furthermore, this control can include correcting the shape of the shot region by applying heat to the substrate. In the contact step, next, the controller 6 controls the mold driving mechanism 3 so as to bring the pattern portion 7a of the mold 7 into contact with the imprint material 9 on the shot region. In the contact step, the controller 6 may control the driving of the mold 7 by the mold driving mechanism 3 and determine the end of the contact step based on the output of a load sensor embedded in the mold driving mechanism 3. In the contact step, the droplets of the imprint material 9 spread and become connected with each other to form a film, and imprint material 9 fills the concave portions of the pattern portion 7a. A more accurate alignment of the pattern portion 7a of the mold 7 and the shot region may be performed in the contact step.

Next, in the curing step, the controller 6 controls the curing unit 2 to irradiate the imprint material 9 between the shot region and the pattern portion 7a of the mold 7 with the curing energy 8. As a result, the imprint material 9 between the shot region and the pattern portion 7a of the mold 7 is cured, and a pattern made of the cured imprint material 9 is formed. Next, in the separation step, the controller 6 controls the mold driving mechanism 3 to separate the pattern portion 7a of the mold 7 from the cured imprint material 9 on the shot region.

The change in the shape of the droplet 32 of the imprint material in the contact step will be described with reference to FIGS. 3A and 3B. The pattern portion 7a of the mold 7 includes the pattern 30. Note that the black lines and the regions between the black lines can be understood as the convex portions and the concave portions, respectively, in FIGS. 3A and 3B. When the droplet 32 is arranged in the manner shown in FIG. 3A in the arrangement step and the pattern portion 7a comes into contact with the droplet 32 in the contact step, the droplet 32 gradually spreads in the manner shown in FIG. 3B. At this time, the droplet 32 tends to spread in a vertical direction (Y direction), that is, the main axis direction 31 which has less resistance. In a direction perpendicular to the main axis direction 31, the droplet 32 needs to spread through the gaps between the convex portions of the pattern portion 7a and the substrate 10, and these gaps can act as the resistance. Hence, the spread of the droplet 32 proceeds so as to form an elliptical shape or an oblong circle shape having the main axis direction 31 as the major axis and the direction perpendicular to the main axis direction 31 as the minor axis. The concave portions of the pattern portion 7a are filled by the droplet 32 along with this spread of the droplet 32.

Figure 4A:
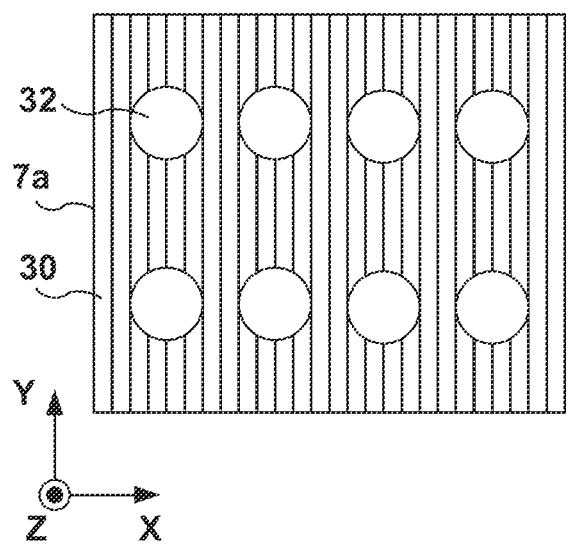
FIGS. 4A to 4D are views exemplifying the arrangement of a plurality of imprint material droplets and the spread of the droplets in a contact step according to a comparative example.
Figure 4B:
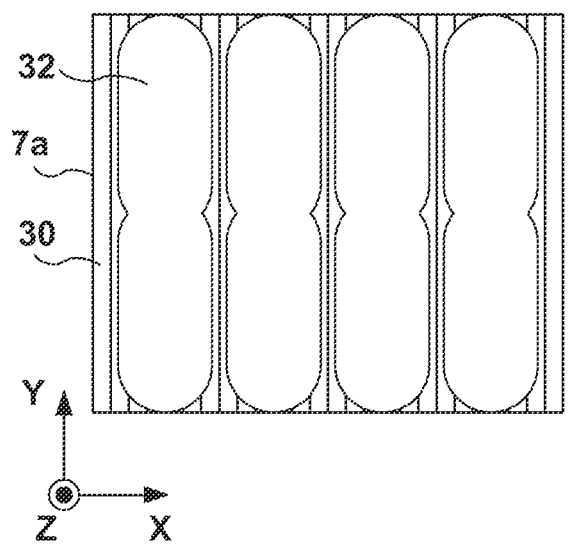
Figure 4C:
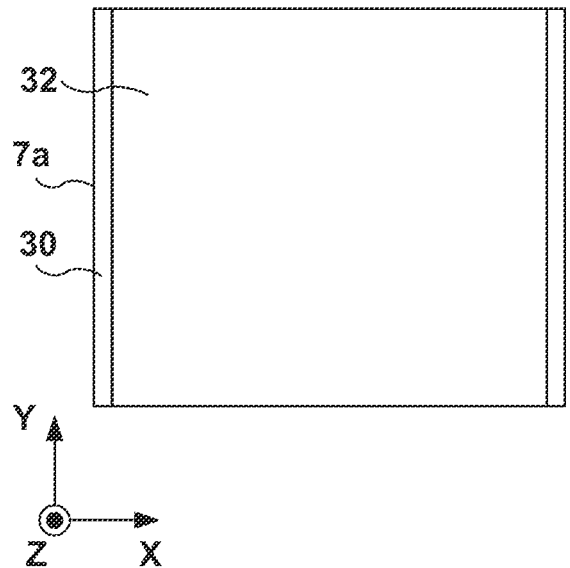
Figure 4D:
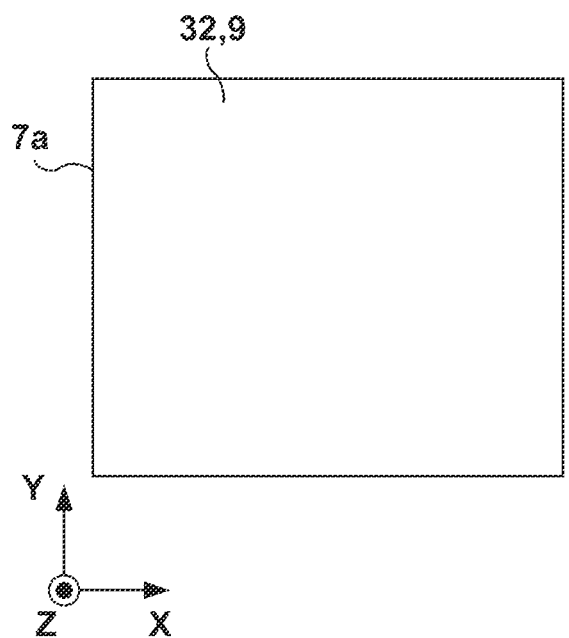

FIGS. 4A to 4D exemplify an arrangement example of the plurality of droplets 32 of an imprint material and their spreads as a comparative example. The number of droplets 32 can be provided by a quotient obtained by dividing the volume of the space between the substrate and the pattern portion 7a by the volume of one droplet 32. The plurality of droplets 32 are arranged as shown in FIG. 4A in the arrangement step. At this time, in consideration of the spread of each droplet 32 as shown in FIG. 3B, the droplets 32 can be arranged in a rectangular grid pattern in which the interval between the droplets 32 in the main axis direction is larger than the interval between the droplets 32 in the direction perpendicular to the main axis direction. In FIGS. 4B, 4C, and 4D, the droplets 32 gradually spread in the contact step, and ultimately a film formed by the connection of the plurality of the droplets 32 can spread throughout the entire region of the pattern portion 7a.

In the comparative example shown in FIGS. 4A to 4D, since the droplets 32 are arranged at positions slightly away from a boundary (the peripheral edge of the pattern portion 7a) between the pattern portion 7a and its external region (region which does not include the concave portion forming the pattern), it takes a long time for the droplets 32 to spread to the boundary. This can mean that a long time is required for the imprint material 9 to fill the space between the substrate 10 and the pattern portion 7a and that the improvement of throughput (productivity) will be prevented.

Hence, in the first embodiment, data (a drop recipe) for controlling the arrangement step of arranging the droplets 32 on the substrate 10 so as to reduce the time required for the imprint material 9 to fill the space between the substrate 10 and the pattern portion 7a is generated. The data for controlling the arrangement step of arranging the droplets 32 on the substrate 10 can be generated by the controller 6, but can also be generated by a processor of another computer or the like which is not connected to the imprint apparatus 1.

Figure 5:
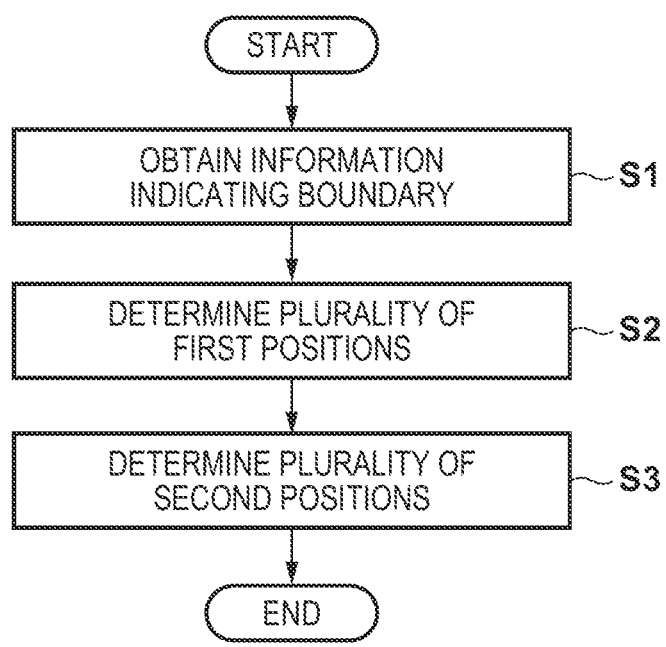
FIG. 5 is a flowchart illustrating a data generation method to generate data (a drop recipe) for controlling an arrangement step of arranging the imprint material droplets on the substrate.

FIG. 5 illustrates the sequence of a data generation method of generating data (a drop recipe) for controlling the arrangement step of arranging the droplets 32 of the imprint material 9 on the substrate 10. The data generation method may be performed by the controller 6 as described above or may be performed by the other computer which is not connected to the imprint apparatus 1. In addition, the controller 6 that performs the data generation method is a controller formed by installing a computer program 62 in a computer that includes a processor 61, and the processor 61 will execute the computer program 62.

In step S1 (obtainment step), the processor 61 obtains information related to the boundary of the pattern portion 7a of the mold 7. The information related to the boundary of the pattern portion 7a of the mold 7 can be information indicating a boundary BD of the pattern portion 7a or a region whose distance from the boundary BD is within a predetermined distance. This information can be obtained from information (for example, design information of the pattern) related to the pattern of the pattern portion 7a. Alternatively, this information can be input by an operator by operating a console (not shown). The first embodiment will describe an example in which the boundary between the pattern portion 7a and the region outside the pattern portion 7a can be considered as the boundary of the pattern portion 7a. In the example shown in FIGS. 6A to 6D, the boundary of the pattern portion 7a is the boundary BD between the pattern portion 7a and the region outside the pattern portion 7a.

Figure 6A:
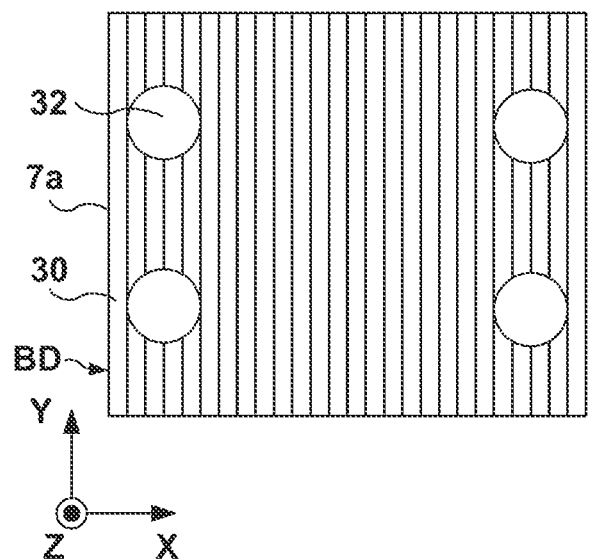
FIGS. 6A to 6D are views exemplifying the arrangement of a plurality of imprint material droplets and the spread of the droplets in a contact step according to the first embodiment.

Next, in step S2 (first step), the processor 61 determines, as the arrangement target position of the imprint material 9, a plurality of positions on the substrate 10 based on the information obtained in step S1. More specifically, as the arrangement target positions of the imprint material 9, in step S2 (first embodiment), the processor 61 can determine, on the substrate 10, a plurality of first positions that face the boundary BD of the pattern portion 7a or the region whose distance from the boundary BD is within a predetermined distance. The region whose distance from the boundary BD is within a predetermined distance can be preset so the time required for the droplets 32 to spread from the positions where the droplets 32 of the imprint material 9 are arranged to the boundary BD will satisfy the requirement specification and the spread droplets 32 will not exceed outside the boundary BD. FIG. 6A schematically shows the droplets 32 of the imprint material 9 arranged on the plurality of first positions determined in step S2 (first step). Note that step S2 (first step) is not a step in which the droplets 32 of the imprint material 9 will be arranged actually on the substrate 10 and is a step of determining the positions at which the droplets 32 are to be arranged. The plurality of first positions (alternatively, the region whose distance from the boundary BD is within a predetermined distance) can be determined based on how easily the droplets 32 spread in the main axis direction and in the direction perpendicular to the main axis direction. Each of the plurality of first positions can be the center position of (the droplet 32) of the imprint material 9 to be arranged on the substrate 10.

Figure 6B:
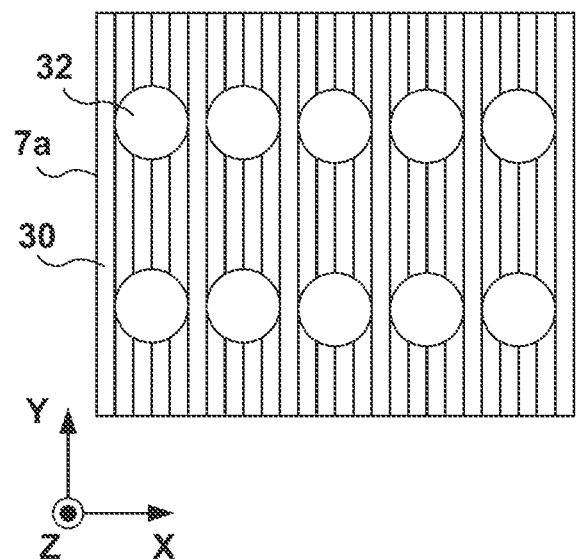

After the step S2 (first step), in step S3 (second step), the processor 61 determines a plurality of second positions different from the plurality of first positions as positions where the imprint material needs to be further arranged. Each of the plurality of second positions can be the center position of (the droplet 32) of the imprint material 9 to be arranged on the substrate 10. In step S2, the processor 61 can determine the plurality of second positions so that the plurality of second positions will include positions which are at least partially sandwiched by the plurality of first positions. Alternatively, in step S2, the processor 61 can determine the plurality of second positions so that the plurality of second positions will be arranged uniformly in a region surrounded by the plurality of first positions. In this case, the plurality of second positions can be determined based on how easily the droplets 32 spread in the main axis direction and in the direction perpendicular to the main axis direction. FIG. 6B schematically shows the droplets 32 of the imprint material 9 arranged at the plurality of first positions determined in step S2 (first step) and at the plurality of second positions determined in step S3 (second step). Note that step S3 (second step) is not a step in which the droplets 32 of the imprint material 9 are arranged actually on the substrate 10, but a step of determining the positions at which the droplets 32 need to be arranged. In one example, the distance between the boundary BD and each of the plurality of first positions is shorter than the minimum distance between the plurality of second positions.

Figure 11:
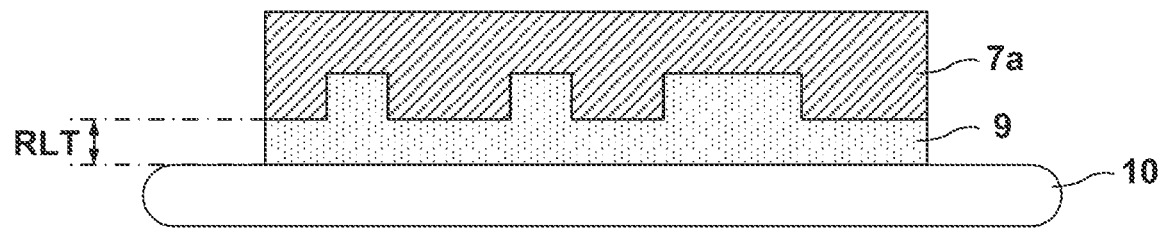
FIG. 11 is a view showing an example of a residual layer thickness (RLT) of a pattern formed by executing a curing step.

In contrast to the comparative example shown in FIG. 4B, the columns of the droplets 32 have one extra column in the example shown in FIG. 6B. Hence, when the arrangement of the droplets 32 shown in FIG. 6B is used, the residual layer thickness of the pattern formed by performing the curing step will be larger than that formed by using the arrangement of the droplets 32 shown in FIG. 4B. FIG. 11 shows a residual layer thickness RLT of the pattern formed by performing the curing step. In this case, letting N be the number of droplets 32 which satisfies the residual layer thickness RLT that has been set, it is preferable to restrict the number N1 of the plurality of first positions and the number N2 of the plurality of second positions so that the difference between N and N1+N2 which is a total of the number N1 of the plurality of first positions and the number N2 of the plurality of second positions will be equal to or less than 5%.

Figure 6C:
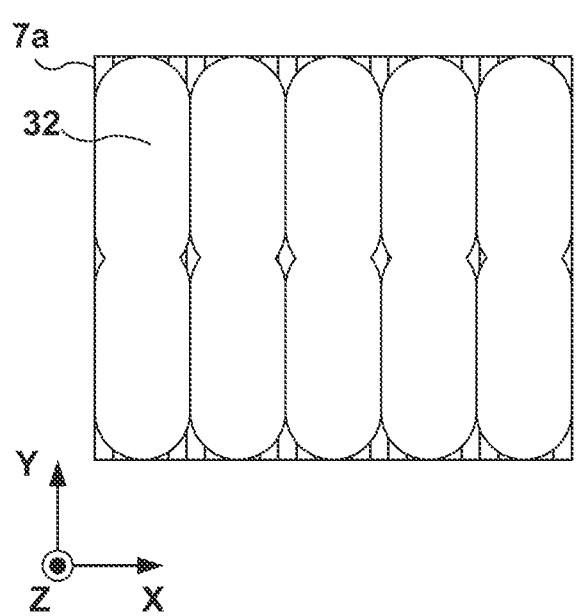
Figure 6D:
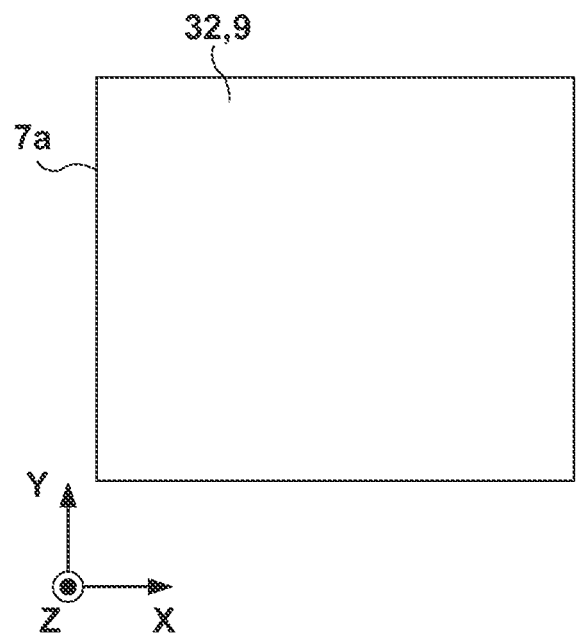

FIGS. 6C and 6D schematically show the spread of the droplets 32 in the contact step when the plurality of first positions and the plurality of second positions have been determined as shown in FIGS. 6A and 6B. In other words, FIGS. 6C and 6D schematically show the spread of the droplets 32 in the contact step in a case in which the arrangement step has been performed in accordance with the data (drop recipe) generated according to the data generation method shown in FIG. 5. As schematically shown in FIG. 6C, the imprint material 9 can spread to the boundary of the pattern portion 7a after the plurality of droplets 32 of the imprint material 9 become connected to each other.

According to the first embodiment, in step S2 (first step) of the data generation step of generating data for controlling the arrangement step of arranging the imprint material 9 on the substrate 10, a plurality of first positions are determined in consideration of the spread of the imprint material 9 to the boundary BD of the pattern portion 7a. More specifically, according to the first embodiment, the plurality of first positions facing the boundary BD of the pattern portion 7a or a preset range from the boundary BD are determined as the arrangement target positions of the imprint material 9. In addition, according to the first embodiment, a plurality of second positions as positions where the imprint material 9 needs to be additionally arranged are subsequently determined. Therefore, the first embodiment is advantageous in improving throughput by reducing the time required for the imprint material 9 to spread to the boundary BD of the pattern portion 7a.

The pieces of information related to the speed of the spread of the droplets 32 in the main axis direction and the speed of the spread of the droplets 32 in the direction perpendicular to the main axis direction that need to be considered to determine the plurality of first positions and the plurality of second positions can be obtained by performing measurement in advance by using a test lot. Alternatively, the pieces of information related to the speed of the spread of the droplets 32 in the main axis direction and the speed of the spread of the droplets 32 in the direction perpendicular to the main axis direction can be prepared based on a simulation or past results.

The second embodiment of the present invention will be described hereinafter. Note that matters not mentioned in the second embodiment follow those of the first embodiment. In the first embodiment, the boundary between the pattern portion 7a and a region outside the pattern portion 7a is considered to be the boundary of the pattern portion 7a. In the second embodiment, a pattern portion 7a further includes at least two regions whose features of the concave portions that form the pattern are different from each other, and other than the boundary between the pattern portion 7a and a region outside the pattern portion 7a, the boundary of the at least two regions is also considered as the boundary of the pattern portion 7a. In the second embodiment, at least two regions whose directions in which the concave portions extend are different from each other are considered as the at least two regions whose features of the concave portions that form the pattern are different from each other.

Figure 7A:
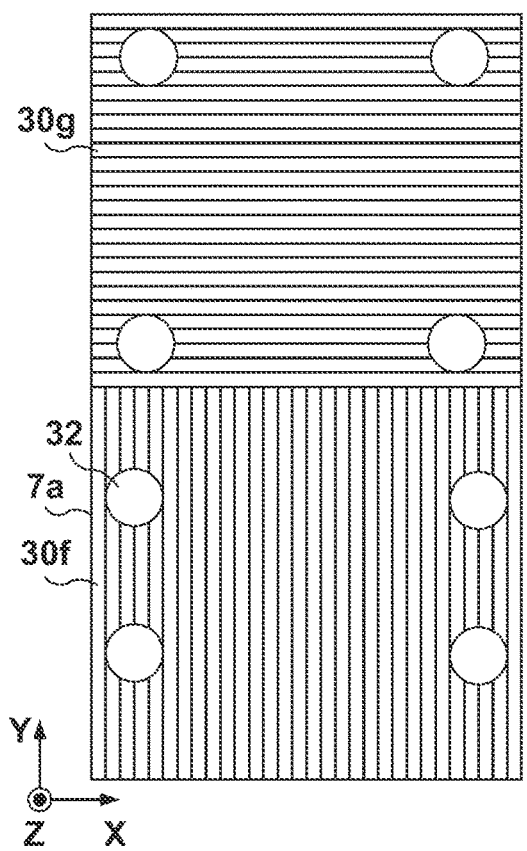
FIGS. 7A to 7D are views exemplifying the arrangement of a plurality of imprint material droplets and the spread of the droplets in a contact step according to the second embodiment.
Figure 7B:
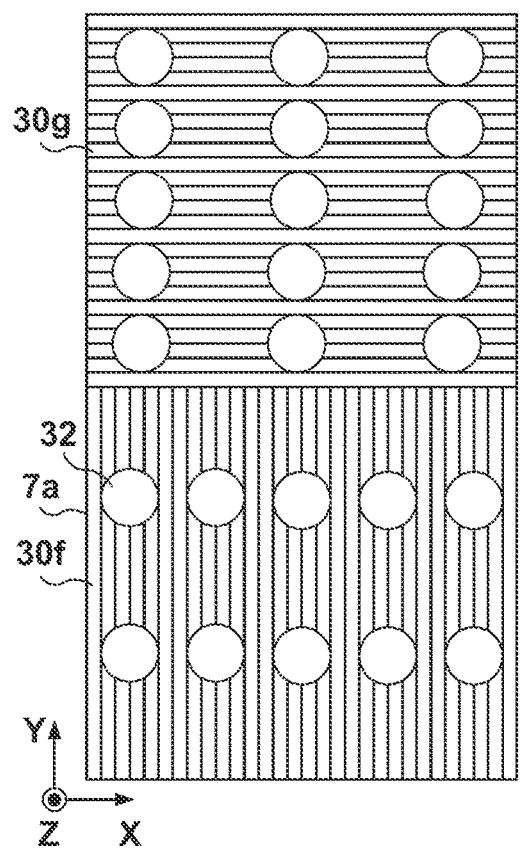

The pattern portion 7a including two regions 30f and 30g whose directions in which the concave portions extend are different from each other is exemplified in FIGS. 7A to 7D. In the two regions 30f and 30g, since the directions in which the concave portions extend differ from each other by 90°, their respective main axis directions also differ from each other by 90°. FIGS. 7A and 7B show a plurality of first positions and a plurality of second positions in one example.

Figure 7C:
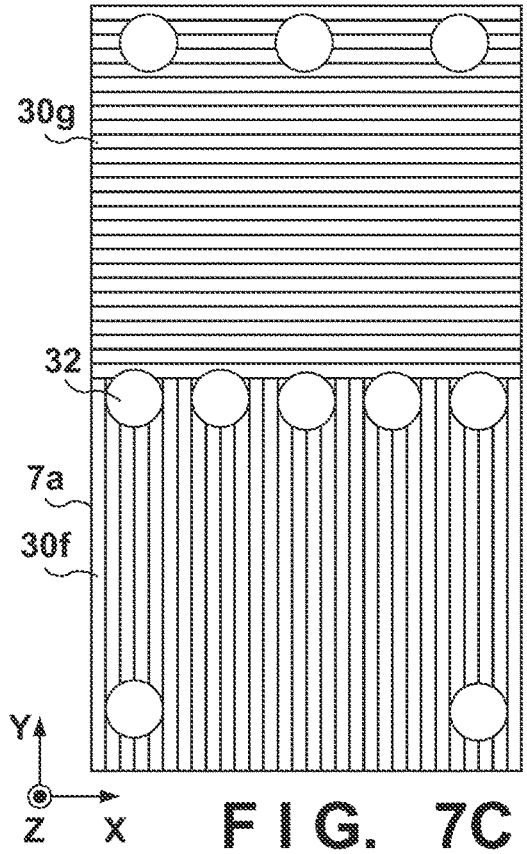
Figure 7D:
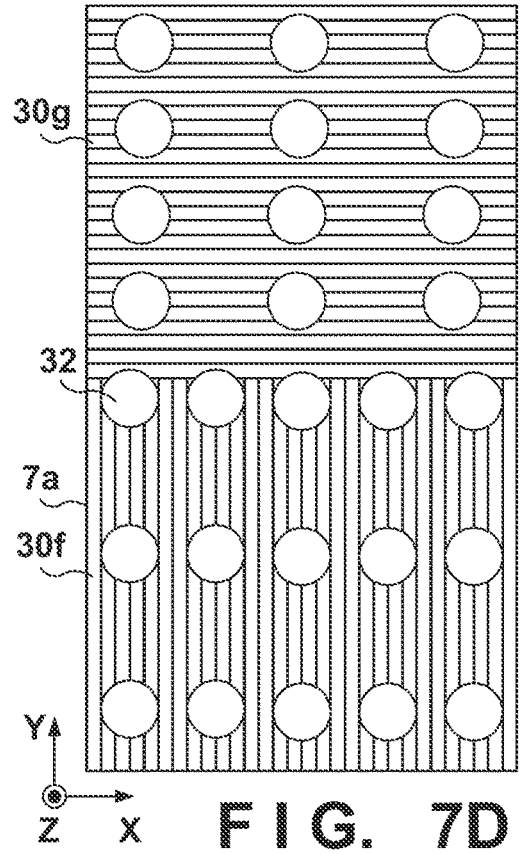

FIGS. 7C and 7D show a plurality of first positions and a plurality of second positions in another example.

FIG. 7A schematically shows droplets 32 of an imprint material 9 arranged at a plurality of first positions determined in step S2 (first step). Note that step S2 (first step) is not a step of actually arranging the droplets 32 on the imprint material 9 on the substrate 10, but a step of determining the target arrangement positions of the droplets 32. FIG. 7B schematically shows the droplets 32 of the imprint material 9 arranged at the plurality of first positions determined as shown in FIG. 7A in step S2 (first step) and at a plurality of second positions determined in step S3 (second step). Note that step S3 (second step) is not a step of actually arranging the droplets 32 on the imprint material 9 on the substrate 10, but a step of determining the target arrangement positions of the droplets 32.

FIG. 7C schematically shows the droplets 32 of the imprint material 9 arranged at a plurality of first positions determined in step S2 (first step). Note that step S2 (first step) is not a step of actually arranging the droplets 32 on the imprint material 9 on the substrate 10, but a step of determining the target arrangement positions of the droplets 32. As exemplified in FIG. 7C, the plurality of first positions can be determined so that the droplets 32 of the imprint material can be arranged across the two regions 30f and 30g. Such droplets 32 can easily spread in both of the two regions 30f and 30g in the contact step. FIG. 7D schematically shows the droplets 32 of the imprint material 9 arranged at the plurality of first positions determined as shown in FIG. 7C in step S2 (first step) and a plurality of second positions determined in step S3 (second step). Note that step S3 (second step) is not a step of actually arranging the droplets 32 on the imprint material 9 on the substrate 10, but a step of determining the target arrangement positions of the droplets 32.

The third embodiment of the present invention will be described hereinafter. Note that matters not mentioned in the third embodiment follow those of the first embodiment. In the first embodiment, the boundary between the pattern portion 7a and a region outside the pattern portion 7a is considered to be the boundary of the pattern portion 7a. In the third embodiment, a pattern portion 7a further includes at least two regions whose features of the concave portions that form the pattern are different from each other, and other than the boundary between the pattern portion 7a and a region outside the pattern portion 7a, the boundary of the at least two regions is also considered as the boundary of the pattern portion 7a. In the third embodiment, at least two regions that have different densities of concave portions from each other are considered as the at least two region whose features of the concave portions that form the pattern are different from each other. The third embodiment can be implemented in combination with the second embodiment. That is, the at least two regions whose features of the concave portions that form the pattern are different from each other can include at least two regions in which at least one of a direction in which the concave portions extend and the density of the concave portions differs. The density of the concave portions can be evaluated by the density of the concave portions in an area which is almost equal to or larger than an area where one droplet 32 can spread in the contact step. For example, the density of the concave portions can be evaluated by the ratio of the concave portion area to an area of several 100 µm² (for example, 200 µm² or 300 µm²).

Figure 8A:
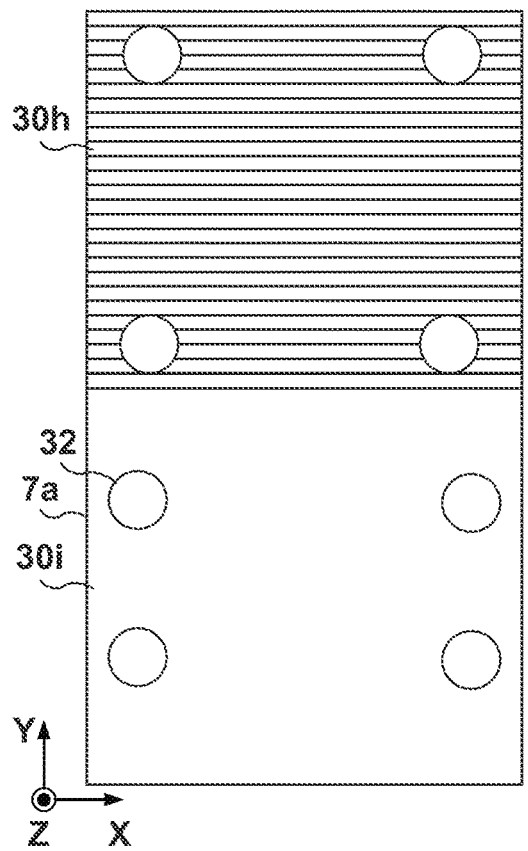
FIGS. 8A to 8D are views exemplifying the arrangement of a plurality of imprint material droplets and the spread of the droplets in a contact step according to the third embodiment.
Figure 8B:
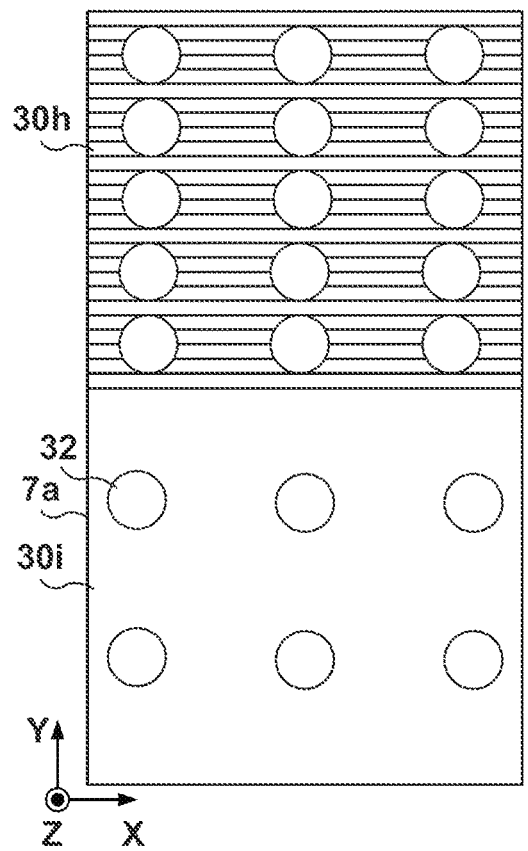
Figure 8C:
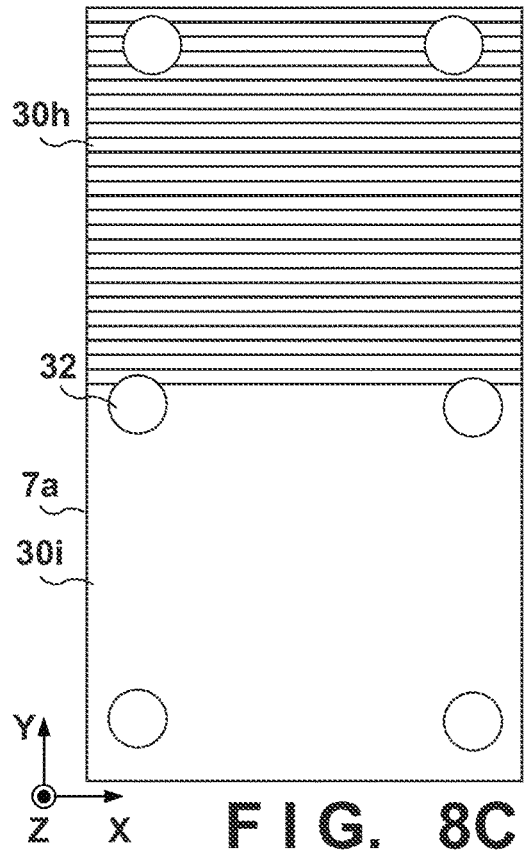
Figure 8D:
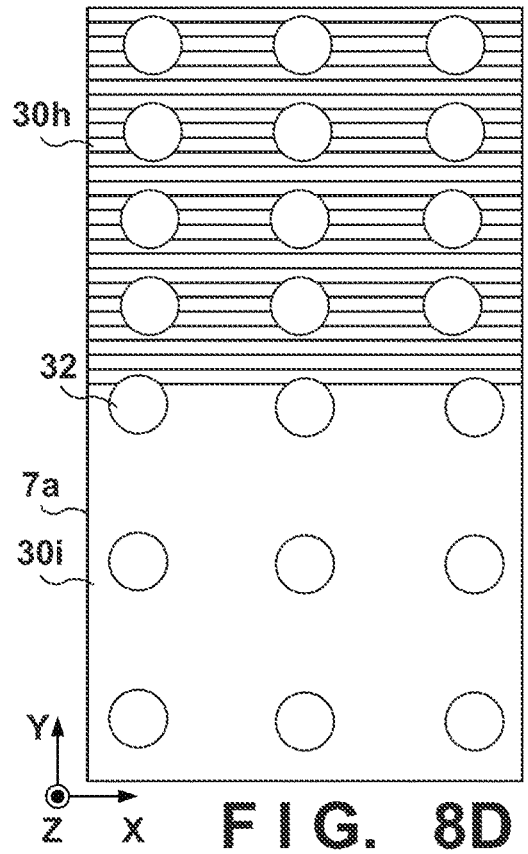

The pattern portion 7a including two regions 30h and 30i that have different densities of the concave portions from each other is exemplified in FIGS. 8A to 8D. In this example, the region 30h is a region whose density of the concave portions is a density other than 0, that is, a region that includes concave portions, and the region 30i is a region whose density of the concave portions is 0, that is, a flat region. FIGS. 8A and 8B show a plurality of first positions and a plurality of second positions in one example. FIGS. 8C and 8D show a plurality of first positions and a plurality of second positions in another example.

FIG. 8A schematically shows the droplets 32 of an imprint material 9 arranged at a plurality of first positions determined in step S2 (first step). Note that step S2 (first step) is not a step of actually arranging the droplets 32 on the imprint material 9 on a substrate 10, but a step of determining the target arrangement positions of the droplets 32. FIG. 8B schematically shows the droplets 32 of the imprint material 9 arranged at the plurality of first positions determined as shown in FIG. 8A in step S2 (first step) and at a plurality of second positions determined in step S3 (second step). Note that step S3 (second step) is not a step of actually arranging the droplets 32 on the imprint material 9 on the substrate 10, but a step of determining the target arrangement positions of the droplets 32. In the region 30h, since concave portions are present and there is a direction in which the concave portions extend, there is a main axis direction. Hence, for the region 30h, the plurality of first positions and the plurality of second positions can be determined in consideration of the main axis direction. In the region 30i, there are no concave portions and the droplets 32 can spread isotropically. Hence, for the region 30i, the plurality of first positions and the plurality of second positions can be arranged so as to have equal pitches in the X-axis direction and in the Y-axis direction.

FIG. 8C schematically shows the droplets 32 of the imprint material 9 arranged at a plurality of first positions determined in step S2 (first step). Note that step S2 (first step) is not a step of actually arranging the droplets 32 on the imprint material 9 on a substrate 10, but a step of determining the target arrangement positions of the droplets 32. As exemplified in FIG. 8C, the plurality of first positions can be determined so that the droplets 32 of the imprint material can be arranged across the two regions 30h and 30i. Such droplets 32 can easily spread in both of the two regions 30h and 30i in the contact step. FIG. 8D schematically shows the droplets 32 of the imprint material 9 arranged at the plurality of first positions determined as shown in FIG. 8C in step S2 (first step) and a plurality of second positions determined in step S3 (second step). Note that step S3 (second step) is not a step of actually arranging the droplets 32 on the imprint material 9 on the substrate 10, but a step of determining the target arrangement positions of the droplets 32.

Figure 9A:
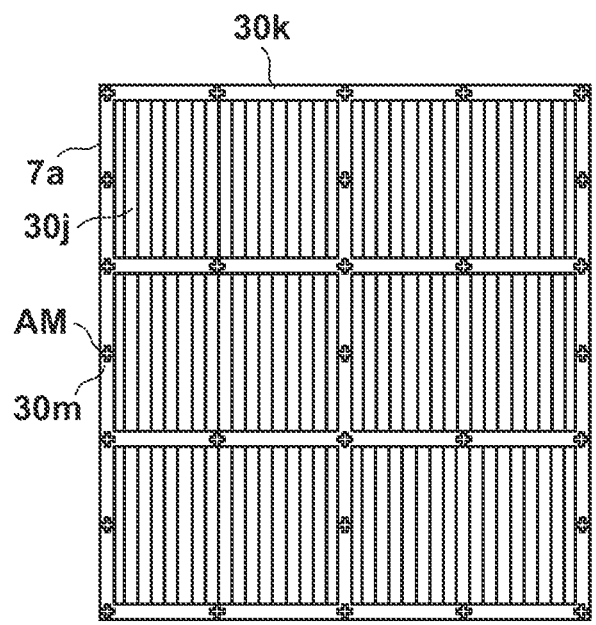
FIGS. 9A to 9C are views exemplifying the arrangement of a plurality of imprint material droplets according to the fourth embodiment.

The fourth embodiment of the present invention will be described hereinafter. Note that matters not mentioned in the fourth embodiment follow those of the first to third embodiments or a combination of at least two of these embodiments. In the fourth embodiment, as exemplified in FIG. 9A, a pattern portion 7a includes at least three regions 30j, 30k, and 30m whose features of the concave portions that form the pattern are different from each other, and the boundaries between these regions 30j, 30k, and 30m are considered. The pattern portion 7a includes a plurality of regions 30j as a plurality of chip regions and a scribe line region that separates the plurality of regions 30j. The scribe line region includes regions 30k forming flat portions without concave portions and regions 30m including alignment marks AM.

Figure 9B:
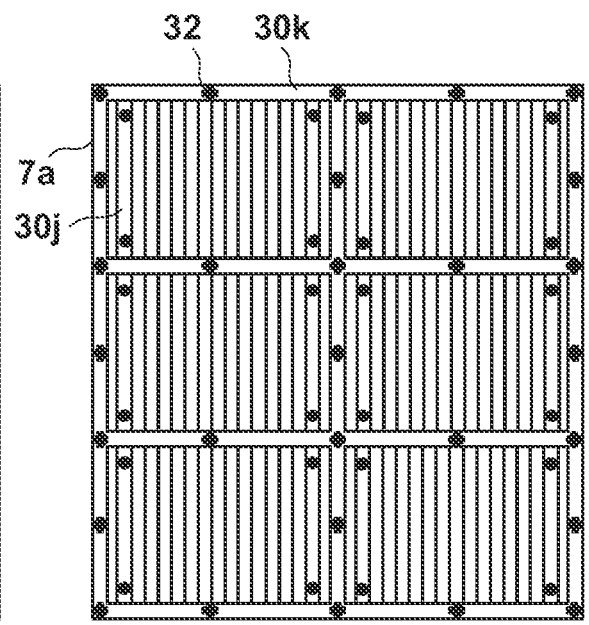
Figure 10:
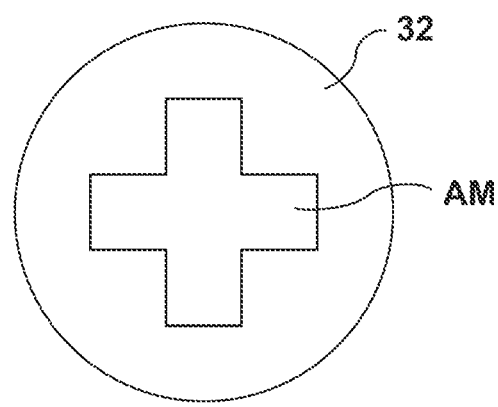
FIG. 10 is a view showing an example of the positional relationship between an alignment mark and the imprint material droplet according to the fourth embodiment.

FIG. 9B schematically shows droplets 32 of an imprint material 9 arranged at a plurality of first positions determined in step S2 (first step). Note that step S2 (first step) is not a step of actually arranging the droplets 32 on the imprint material 9 on a substrate 10, but a step of determining the target arrangement positions of the droplets 32. The plurality of first positions can include positions in the regions 30$m$ where the alignment marks AM have been arranged. The size of each alignment mark AM is, for example, several tens to several hundreds of μm, and the size of each droplet 32 can be, for example, several hundred μm. The concave portion forming each alignment mark AM is a portion that is difficult to be filled by the imprint material 9. Arranging the droplets 32 so as to cover the alignment marks AM is advantageous in reducing the time required for the filling operation of the imprint material 9. In addition to that described above, the plurality of first positions can be determined in the same manner as the first embodiment in consideration of the boundaries between the regions 30$j$ and the regions 30$k$. Of the plurality of first positions, each first position that corresponds to the alignment mark AM can be determined so that at least a part of the alignment mark AM will be covered by the droplet 32 of the imprint material 9. Preferably, of the plurality of first positions, each first position that corresponds to the alignment mark AM can be determined so that the droplet 32 of the imprint material 9 will completely cover the alignment mark AM as exemplified in FIG. 10.

Figure 9C:
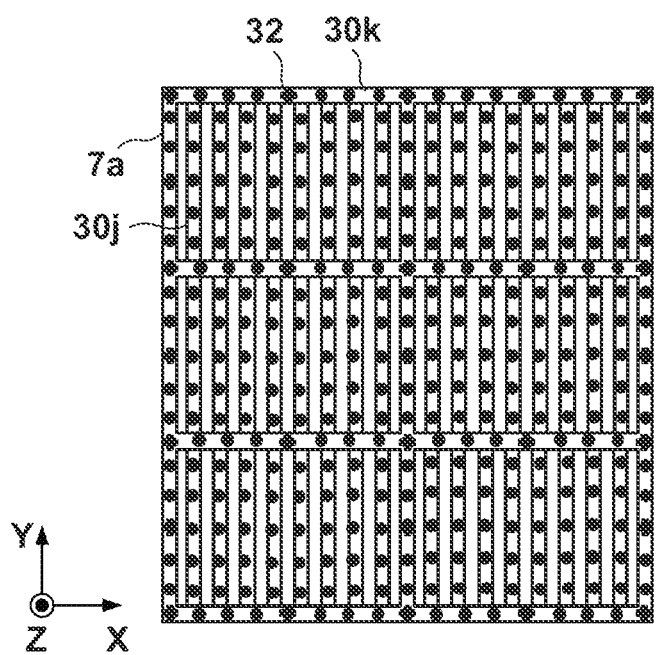

FIG. 9C schematically shows the droplets 32 of the imprint material 9 arranged at the plurality of first positions determined as shown in FIG. 9B in step S2 (first step) and a plurality of second positions determined in step S3 (second step). Note that step S3 (second step) is not a step of actually arranging the droplets 32 on the imprint material 9 on the substrate 10, but a step of determining the target arrangement positions of the droplets 32.

The concept of arranging the droplets 32 so as to cover the alignment marks AM according to the fourth embodiment can be employed independently of the first to third embodiments described above. That is, the fourth embodiment may be implemented as an imprint process of forming a pattern on the substrate 10 that includes the alignment mark AM. The imprint method can include an arrangement step of arranging the plurality of droplets 32 of the imprint material 9 on the substrate 10, a contact step of bringing the imprint material 9 and the pattern portion 7$a$ of a mold 7 into contact with each other after the arrangement step, and a curing step of curing the imprint material 9 after the contact step. In the arrangement step, the plurality of the droplets 32 can be arranged so that each alignment mark AM will be covered by one of the plurality of the droplets 32.

In the same manner, the fourth embodiment may be implemented as an imprint apparatus 1 that forms a pattern on the substrate 10 that includes the alignment marks AM. The imprint apparatus 1 can include a dispenser 5 that arranges the plurality of droplets 32 of the imprint material 9 on the substrate 10. In addition, the imprint apparatus 1 can include driving mechanisms (a mold driving mechanism 3 and a substrate driving mechanism 4) that change the relative positions of the substrate 10 and the mold 7, and a curing unit 2 that cures the imprint material 9 in a state in which the driving mechanisms have brought the imprint material 9 on the substrate 10 and the pattern portion 7$a$ of the mold 7 into contact with each other. The dispenser 5 can arrange the plurality of the droplets 32 so that each alignment mark AM will be covered by one of the plurality of the droplets 32.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

Figure 12A:
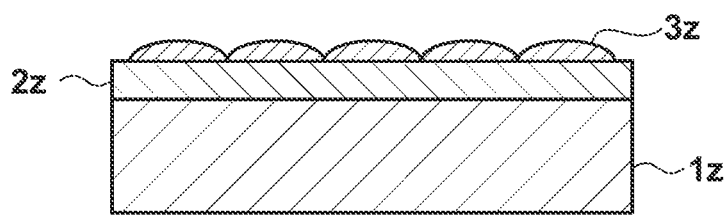
FIGS. 12A to 12F are views exemplifying a method of manufacturing an article.

A method of manufacturing an article in which an imprint apparatus forms a pattern on a substrate, processes the substrate on which the pattern is formed, and manufactures an article from the processed substrate will be described next. As shown FIG. 12A, a substrate 1$z$ such as a silicon wafer with a processed material 2$z$ such as an insulator formed on the surface is prepared. Next, an imprint material 3$z$ is applied to the surface of the processed material 2$z$ by an inkjet method or the like. A state in which the imprint material 3$z$ is applied as a plurality of droplets onto the substrate is shown here.

Figure 12B:
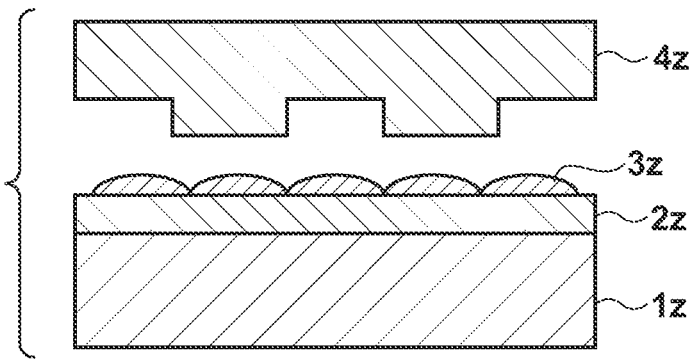
Figure 12C:
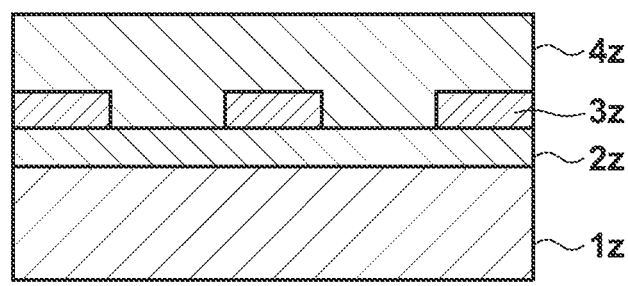

As shown in FIG. 12B, a side of a mold 4$z$ for imprint with a concave-convex pattern is directed toward and made to face the imprint material 3$z$ on the substrate. As shown FIG. 12C, the substrate 1$z$ to which the imprint material 3$z$ is applied is brought into contact with the mold 4$z$, and a pressure is applied. The gap between the mold 4$z$ and the processed material 2$z$ is filled with the imprint material 3$z$. In this state, when the imprint material 3$z$ is irradiated with energy for curing via the mold 4$z$, the imprint material 3$z$ is cured.

Figure 12D:
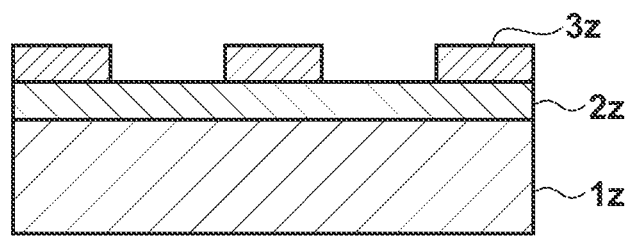

As shown in FIG. 12D, after the imprint material 3$z$ is cured, the mold 4$z$ is separated from the substrate 1$z$, and the pattern of the cured product of the imprint material 3$z$ is formed on the substrate 1$z$. In the pattern of the cured product, the concave portion of the mold corresponds to the convex portion of the cured product, and the convex portion of the mold corresponds to the concave portion of the cured product. That is, the concave-convex pattern of the mold 4$z$ is transferred to the imprint material 3$z$.

Figure 12E:
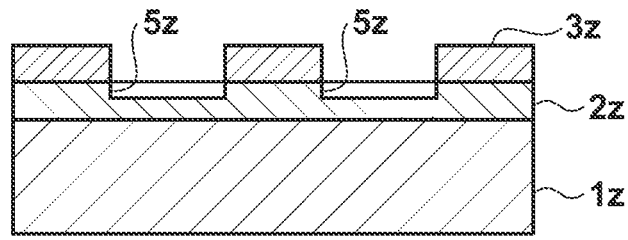
Figure 12F:
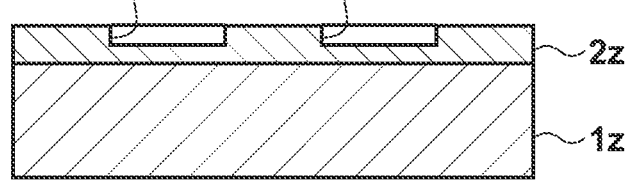

As shown in FIG. 12E, when etching is performed using the pattern of the cured product as an etching resistant mold, a portion of the surface of the processed material 2$z$ where the cured product does not exist or remains thin is removed to form a groove 5$z$. As shown in FIG. 12F, when the pattern of the cured product is removed, an article with the grooves 5$z$ formed in the surface of the processed material 2$z$ can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-099018, filed May 23, 2018, which is hereby incorporated by reference herein in its entirety.

What is claimed is:

1. A computer-implemented data generation method of generating data for controlling an arrangement step in an imprint process that includes the arrangement step of arranging an imprint material on a substrate, a contact step of bringing the imprint material and a pattern portion of a mold into contact with each other, and a curing step of curing the imprint material, wherein the pattern portion includes at least two regions whose features of concave portions that form a pattern are different from each other, the method comprising:

performing a first step of determining a plurality of first positions corresponding to at least a boundary between the at least two regions, as positions where the imprint material is to be arranged;

performing, after the first step, a second step of determining, based on the determined plurality of first positions, a plurality of second positions different from the determined plurality of first positions, as positions where the imprint material is to be further arranged; and outputting the determined plurality of first positions and the second plurality of second positions as the data for controlling the arrangement step;

wherein the arrangement step comprises arranging a plurality of droplets of the imprint material on the substrate based on the output plurality of first positions and the output plurality of second positions.

2. The method according to claim 1, wherein the determined plurality of first positions include first positions corresponding to a boundary of the pattern portion or a region whose distance from the boundary falls within a predetermined distance.

3. The method according to claim 2, wherein the boundary includes a boundary between the pattern portion and a region outside the pattern portion.

4. The method according to claim 1, wherein the determined plurality of second positions include a position sandwiched by at least some of the plurality of first positions.

5. The method according to claim 1, wherein the plurality of second positions are arranged uniformly in a region surrounded by the plurality of first positions.

6. The method according to claim 1, wherein a distance between the boundary and each of the plurality of first positions is smaller than a minimum distance between the plurality of second positions.

7. The method according to claim 1, wherein the at least two regions whose features are different from each other include at least two regions in which at least one of a direction in which the concave portions extend or a density of the concave portions differs.

8. The method according to claim 1, wherein the determined plurality of first positions include a first position where the imprint material is to be arranged so as to cover an alignment mark provided on the substrate.

9. The method according to claim 1, wherein each of the determined plurality of first positions and the determined plurality of second positions is a center position of the imprint material to be arranged on the substrate.

10. The method according to claim 1, further comprising:
obtaining the information related to the boundary,
wherein the first step determines the plurality of first positions based on the obtained information.

11. A non-transitory computer readable storage medium storing a computer program executable by a computer to execute the computer-implemented data generation method according to claim 1.

12. An imprint method of forming a pattern on a substrate, the method comprising:
generating data for controlling the arrangement step according to claim 1;
performing the arrangement step of arranging the plurality of droplets of the imprint material on the substrate based on the generated data;
performing a contact step of bringing the imprint material and a pattern of a mold into contact with each other after the arrangement step; and
performing a curing step of curing the imprint material after the contact step.

13. A computer-implemented data generation method of generating data for controlling an arrangement step in an imprint process that includes the arrangement step of arranging an imprint material on a substrate, a contact step of bringing the imprint material and a pattern portion of a mold into contact with each other, and a curing step of curing the imprint material, the substrate including alignment marks outside a region where the pattern portion is transferred, the method comprising:

performing a first step of determining a plurality of first positions corresponding to the alignment marks, as positions where the imprint material is to be arranged;

performing, after the first step, a second step of determining, based on the determined plurality of first positions, a plurality of second positions different from the determined plurality of first positions, as positions where the imprint material is to be further arranged; and outputting the determined plurality of first positions and the second plurality of second positions as the data for controlling the arrangement step;

wherein the arrangement step comprises arranging a plurality of droplets of the imprint material on the substrate based on the output plurality of first positions and the output plurality of second positions.

14. A non-transitory computer readable storage medium storing a computer program executable by a computer to execute the computer-implemented data generation method according to claim 13.

15. A method of arranging an imprint material on a substrate, for an imprint process including a contact step of bringing the imprint material and a pattern portion of a mold into contact with each other, and a curing step of curing the imprint material, wherein the pattern portion includes at least two regions of concave portions that each form a pattern that is different from each other, the method comprising:

performing a first step of determining a plurality of first positions corresponding to at least a boundary between the at least two regions, as positions where the imprint material is to be arranged;

performing, after the first step, a second step of determining, based on the determined plurality of first positions, a plurality of second positions different from the determined plurality of first positions, as positions where the imprint material is to be further arranged; and arranging a plurality of droplets of the imprint material on the substrate based on the determined plurality of first positions and the determined plurality of second positions.

* * * * *